United States Patent
Buer et al.

[11] Patent Number: 6,091,942
[45] Date of Patent: Jul. 18, 2000

[54] SELF GAIN ALIGNING CIRCUIT AND METHOD

[75] Inventors: Kenneth Vern Buer; David Warren Corman, both of Gilbert; Bill Tabano Agar, Jr., Chandler, all of Ariz.

[73] Assignee: Motorola, Inc., Schaumburg, Ill.

[21] Appl. No.: 08/755,861

[22] Filed: Dec. 2, 1996

[51] Int. Cl.[7] .............................. H01Q 11/12; H04B 1/06
[52] U.S. Cl. ..................... 455/234.1; 455/126; 455/127
[58] Field of Search .................... 455/126, 127, 455/232.1, 234.1, 234.2, 313, 235.1, 240.1, 250.1; 330/129, 136, 279

[56] References Cited

U.S. PATENT DOCUMENTS

| | | | |
|---|---|---|---|
| 3,968,453 | 7/1976 | Hongu | 330/29 |
| 4,553,104 | 11/1985 | Olsen | 330/129 |
| 4,639,938 | 1/1987 | Kennett | 455/126 |
| 4,691,377 | 9/1987 | Yoshihara et al. | 455/245.1 |
| 5,172,071 | 12/1992 | Braathen | 455/126 |
| 5,243,301 | 9/1993 | Tondryk | 330/296 |
| 5,297,184 | 3/1994 | Behrens et al. | 455/234.1 |
| 5,319,804 | 6/1994 | Matsumoto et al. | 455/126 |
| 5,369,789 | 11/1994 | Kosugi et al. | 455/126 |
| 5,375,145 | 12/1994 | Abbott et al. | 455/234.1 |
| 5,432,473 | 7/1995 | Mattila et al. | 455/126 |
| 5,566,363 | 10/1996 | Senda | 455/126 |
| 5,604,924 | 2/1997 | Yokoya | 455/126 |
| 5,613,226 | 3/1997 | Kanami | 455/126 |
| 5,737,033 | 4/1998 | Masuda | 455/240.1 |

Primary Examiner—Reinhard J. Eisenzopf
Assistant Examiner—Edan Orgad
Attorney, Agent, or Firm—Gregory J. Gorrie

[57] ABSTRACT

An K-band amplifier circuit (10) with two samplers (12, 18) coupled to detectors (22, 26) that detect an input and an output RF signal level. These two reference signals are provided to a differential gain control circuit (24) which is coupled to one or more variable gain amplifier (VGA) (14) stages. The VGAs compensate for the gain of an entire chain of amplifiers (16). When the individual amplifier gains vary for any reason, (i.e., process, temperature effects or end of life degradation) the variation in gain causes higher or lower levels of detected output reference signals for a given RF input signal. The gain control circuit (24) drives the VGA (14) up or down as appropriate. By maintaining a constant offset in input and output reference control signals, the gain control circuit (24) drives the amplifier chain (16) to a constant gain.

16 Claims, 5 Drawing Sheets

SELF GAIN ALIGNING CIRCUIT AND METHOD

FIELD OF THE INVENTION

This invention relates in general to the field of microwave circuits, in particular to K-Band microwave amplifiers that maintain a constant gain.

BACKGROUND OF THE INVENTION

In microwave applications, especially high frequency Monolithic Microwave Integrated Circuits (MMIC) applications, process variations, gain ripple across bandwidth, and thermal variations in the frequency performance are problems that are typically solved by tuning. For example, in MMIC applications, slight variation in the fabrication processes may cause large gain variations in the resulting RF and microwave devices. Once these devices are combined into functional chains of circuitry, the total variation becomes quite large. For example, in a chain of 10 microwave circuits where each circuit has a gain variation of 2 dB, the resulting chain may have a worst case gain variation of ±20 dB. If root sum of squares is used to estimate the gain variation and assuming the stages are independent, the gain variation may still be about ±6 dB. These large variations of gain are usually not tolerable and therefore the chain of circuitry must be aligned. RF alignment is time consuming and costly in the manufacturing process, especially in high volume production. If volume production of low cost and very complex microwave hardware is to be a reality, a way of compensating for these process variations without tuning is necessary.

In communication or radar systems for example, where a single carrier or continuous wave (CW) signal is swept in frequency or slowly moved through frequency across several available channels, (i.e., in the case of some cellular communication systems), significant gain ripple may result over a broad bandwidth. Gain ripple is undesirable in these types of systems since this ripple may cause amplitude modulation which may distort the desired modulation waveform. Generally these types of systems contain several stages of amplifiers, filters, mixers, attenuators and other circuitry, all of which have associated interface matching networks and contribute ripple to the final composite performance. In broadband systems, tuning is usually applied at interfaces between these components to reduce the ripple of the system. Accordingly, it is desirable to eliminate or reduce this tuning, especially for high volume production.

Another problem encountered in microwave and RF amplifier design is variation over temperature. Typically microwave amplifiers change about ±7 dB over a 50° Celsius temperature range. The actual change however depends on the amplifier design and the intrinsic device characteristics. As with the process variations mentioned above, temperature variation become more severe and harder to correct at higher frequencies such as K-band. Therefore, temperature effects are generally analyzed and compensated for over the frequency range of interest. Typically temperature compensation is done by using thermistors that control the gain of a variable gain amplifier. Thermistors, however, generally have poor reliability and are therefore less desirable in high reliability applications. Accordingly, it is desirable to have an amplifier circuit that provides gain compensation over temperature without the use of thermistors.

For high reliability applications such as MIL-SPEC and space qualified hardware, the effects of aging performance degradation, radiation degradation and other end-of-life effects may be taken into account. When these effects are significant, either performance margins should exist or the degregated performance should be compensated for in some fashion. Accordingly, what is also needed is a way of compensating for reduced performance over the life of an amplifier.

Accordingly, what is needed is a microwave circuit that compensates for process variations in the fabrication. What is also needed is a microwave circuit that eliminates tuning or reduces tuning. What is also needed is a microwave circuit that provides flat gain over a broad bandwidth for CW signals. And, what is also needed is a microwave circuit that compensates for performance and temperature variation and end of life variation.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference numbers refer to similar items throughout the figures, and:

The exemplification set out herein illustrates a preferred embodiment of the invention in one form thereof, and such exemplification is not intended to be construed as limiting in any manner.

DETAILED DESCRIPTION OF THE DRAWINGS

The present invention provides, among other things, a self-gain aligning circuit and method. The invention solves the problem of initial gain alignment caused by process variation and the fabrication of components for multiple stage microwave and RF amplifiers that are configured in chains. The present invention also provides automatic gain-ripple compensation for a substantially constant gain over a broad bandwidth. The present invention also provides a microwave circuit that includes temperature compensation in multiple RF and microwave amplifier chains and also provides for end of life compensation for degradation and gain performance.

Figure 1:
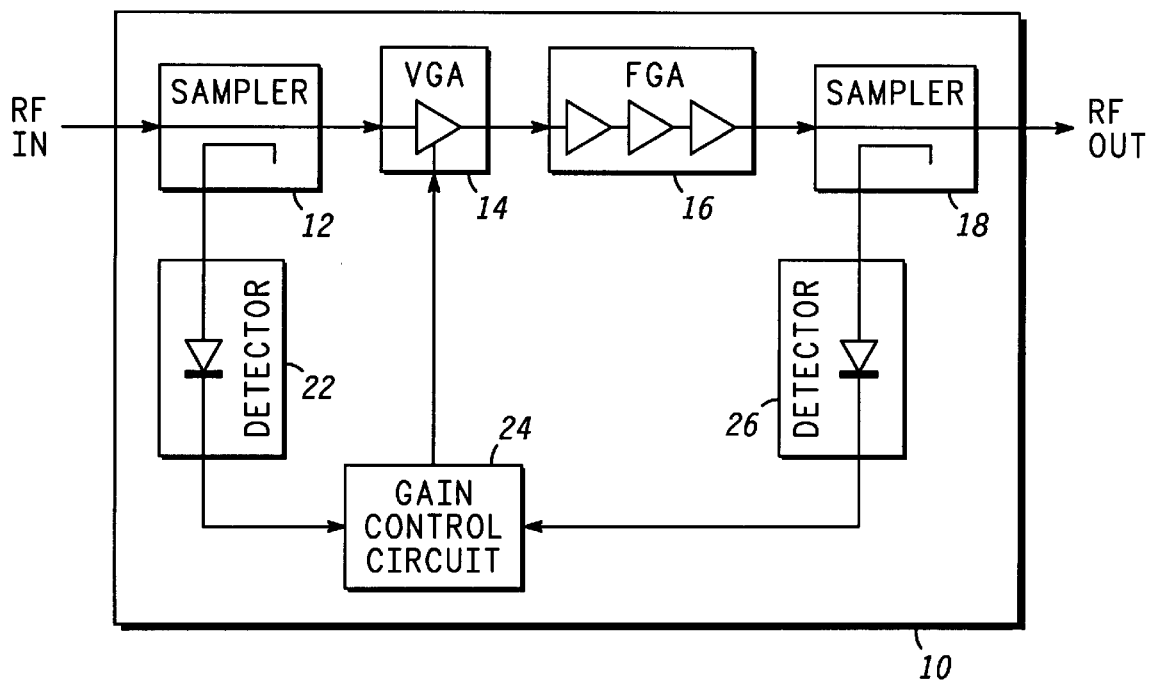
FIG. 1 is a simplified block diagram of a self gain aligning amplifier in accordance with a preferred embodiment of the present invention.

FIG. 1 is a simplified block diagram of a self gain aligning amplifier in accordance with a preferred embodiment of the present invention. FIG. 1 shows self gain aligning amplifier 10 with an RF input and RF output. Typically amplifier 10 provides anywhere between 20 and 60 dB of gain for frequencies in the K-band range. Amplifier 10 includes an input sampler 12 for sampling the input signal and providing a sampled RF signal proportional to the input signal to detector 22. Amplifier 10 also includes a variable gain amplifier 14 (VGA) for amplifying the RF input signal in accordance with a gain control signal provided by gain control circuit GCC 24. In the preferred embodiment, amplifier 10 also includes a fixed gain amplifier 16 for amplifying the RF signal by a predetermined amount. Amplifier 10 also includes a second sampler 18 for sampling the output signal and providing a sampled RF signal proportional to output signal to detector 26. Detectors 22 and 26 preferably provide a voltage proportional to the input and output signals respectively, to GCC 24. Gain control circuit 24 provides a voltage proportional to the difference between the input and output signals to VGA 14. Through the operation GCC 24, amplifier 10 will have a substantially constant gain between the RF in and RF out ports.

In the preferred embodiment amplifier 10 is fabricated on a Duroid substrate as part of a Multi-Chip Module (MCM). Samplers 12 and 18 and preferably fabricated on either alumna or Duroid and are preferable edge coupled microstrip lines. Samplers 10 and 18 preferably provide a signal at least 15 dB lower than the associated direct signal. Amplifiers 14 and 16 are preferably MMIC amplifiers fabricated on a Gallium Arsenide (GaAs) substrate using a quarter-micron PHEMT process. Fixed gain amplifiers 16 preferably use a constant current source for their bias while VGA 14 uses a gain control signal provided by gain control circuit 24 for bias control. In the preferred embodiment, the range of VGA 14 is sufficient to cover the variation over temperature, process variation, end-of-life variation, or the variation over the operating frequency range of all the components between samplers 12 and 18. Accordingly, there may be 1, 2, 3 or more VGAs 14 in series where each VGA's gain is controlled by the gain control signal of gain control circuit 24. Fixed gain amplifier 16 may include several GaAs amplifiers together depending on the desired gain of amplifier 10. Detectors 22 and 26 are preferably GaAs diodes and are desirably matched or from the same substrate lot. Amplifier 10 is desirably designed to operate over the frequency range of 18–30 GHz, and preferably operates over the frequency range of 20–27 GHz.

Figure 2:
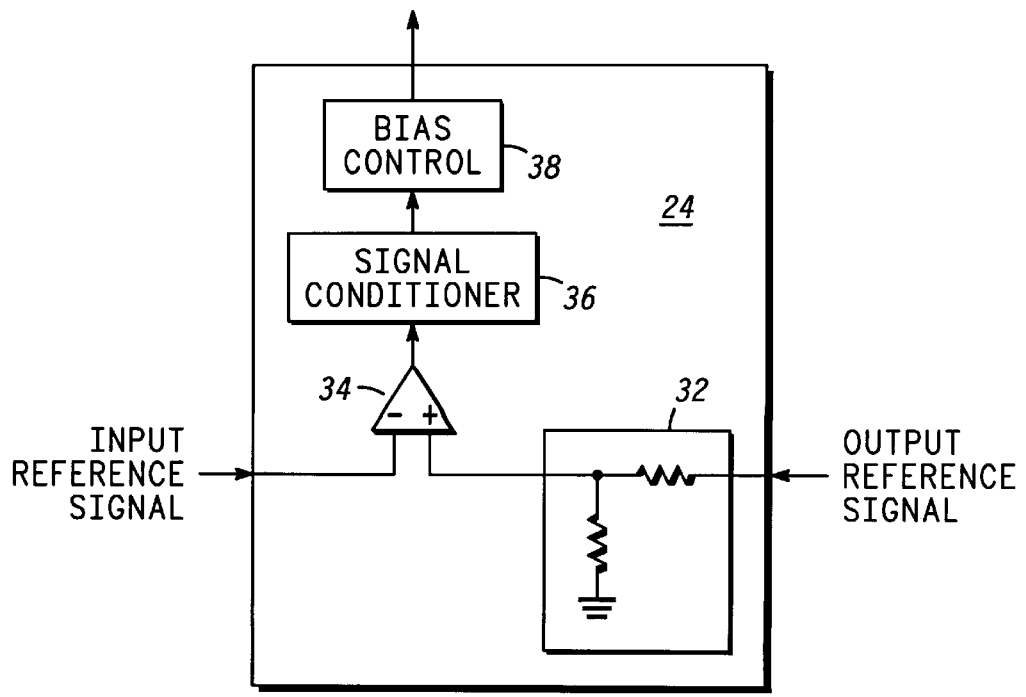
FIG. 2 is a simplified block diagram of a gain control circuit (GCC) suitable for use in accordance with a preferred embodiment of the present invention.

FIG. 2 is a simplified block diagram of a gain control circuit (GCC) suitable for use in accordance with a preferred embodiment of the present invention. Gain control circuit 24 includes a gain adjustment or select circuit 32, a comparator or operational amplifier 34 and preferably includes a signal conditioner circuit 36 and a bias control circuit 38. Gain select circuit 32 is preferably comprised of a voltage divider made from resistors and may include external means for setting the gain of amplifier 10 (FIG. 1). Comparator or operational amplifier 34 compares the voltages between the divided output reference signal from gain select circuit 32 with the input reference signal. Signal conditioner circuit 36 adjusts the voltage level to a range suitable for VGA 14 (FIG. 1). Bias control circuit 38 is preferably a constant current source to provide the current to drive the bias circuitry of VGA 14.

In the preferred embodiment gain control circuit 24 is fabricated from the discrete components on the Duroid board of amplifier 10, however, it may also be fabricated in an ASIC or other means.

Figure 3:
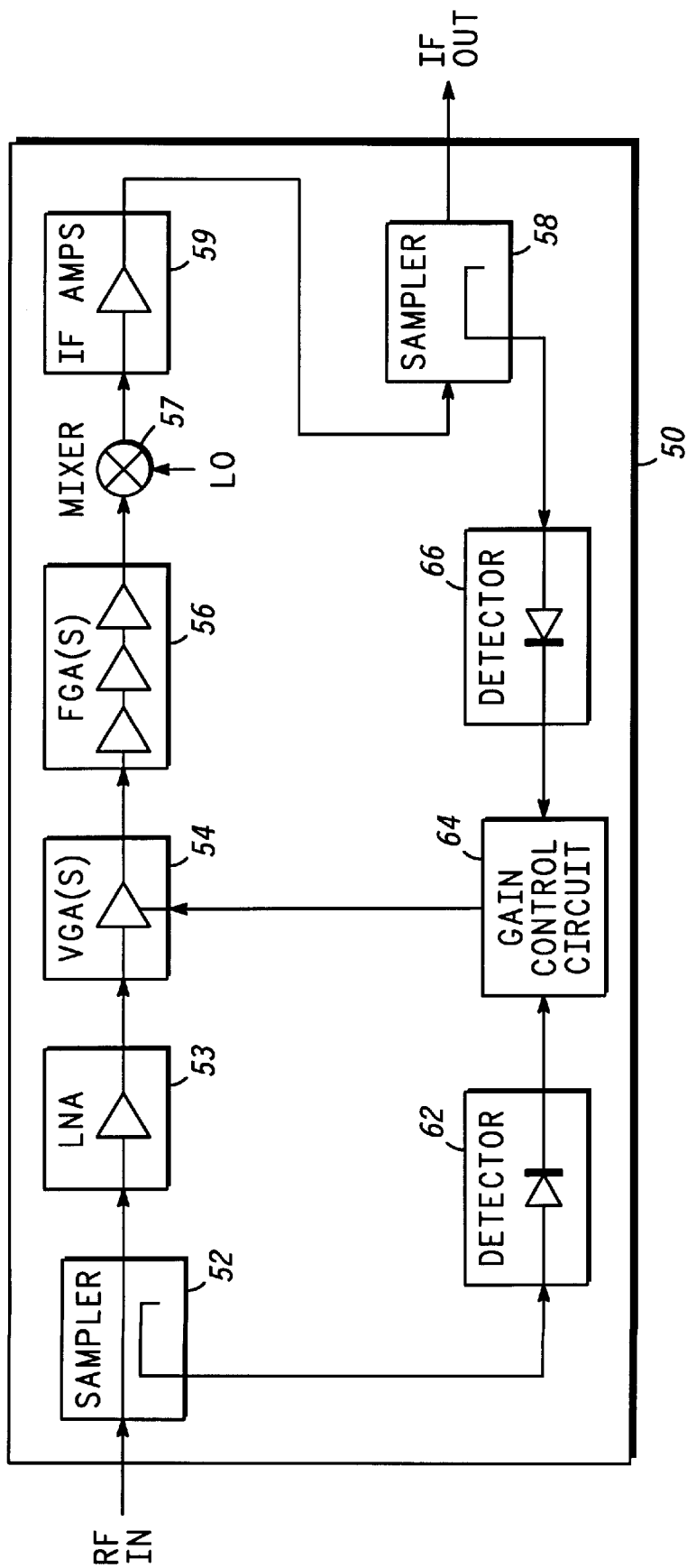
FIG. 3 is a simplified block diagram of a down-converter in accordance with a preferred embodiment of the present invention.

FIG. 3 is a simplified block diagram of a down-converter in accordance with a preferred embodiment of the present invention. Down-converter 50 provides a substantially constant gain over the range of RF input frequencies and associated intermediate frequency (IF) output frequencies. Down-converter 50 includes a low noise amplifier 53 coupled between the input sampler (52) and VGA 54, and mixer 57 coupled between fixed gain amplifiers 56 and IF amplifier 59. In the preferred embodiment the RF input signal varies between the frequencies of 23.18 and 23.38 Gigahertz (GHz), while the IF output varies between 650 megahertz (MHz) and 850 MHz. Over this frequency range for CW signals, the gain is substantially constant. Accordingly, the ripple across the bandpass is substantially flat. In down converter 50, samplers 52 and 58 are substantially similar to samplers 12 and 18 of FIG. 1. Diode detectors 62 and 66 are preferably similar to diode detectors 22 and 26 of FIG. 1. Gain control circuit 84 is substantially similar to gain control 24 (FIG. 1). Local oscillator (LO) is preferably a fixed frequency.

Figure 4:
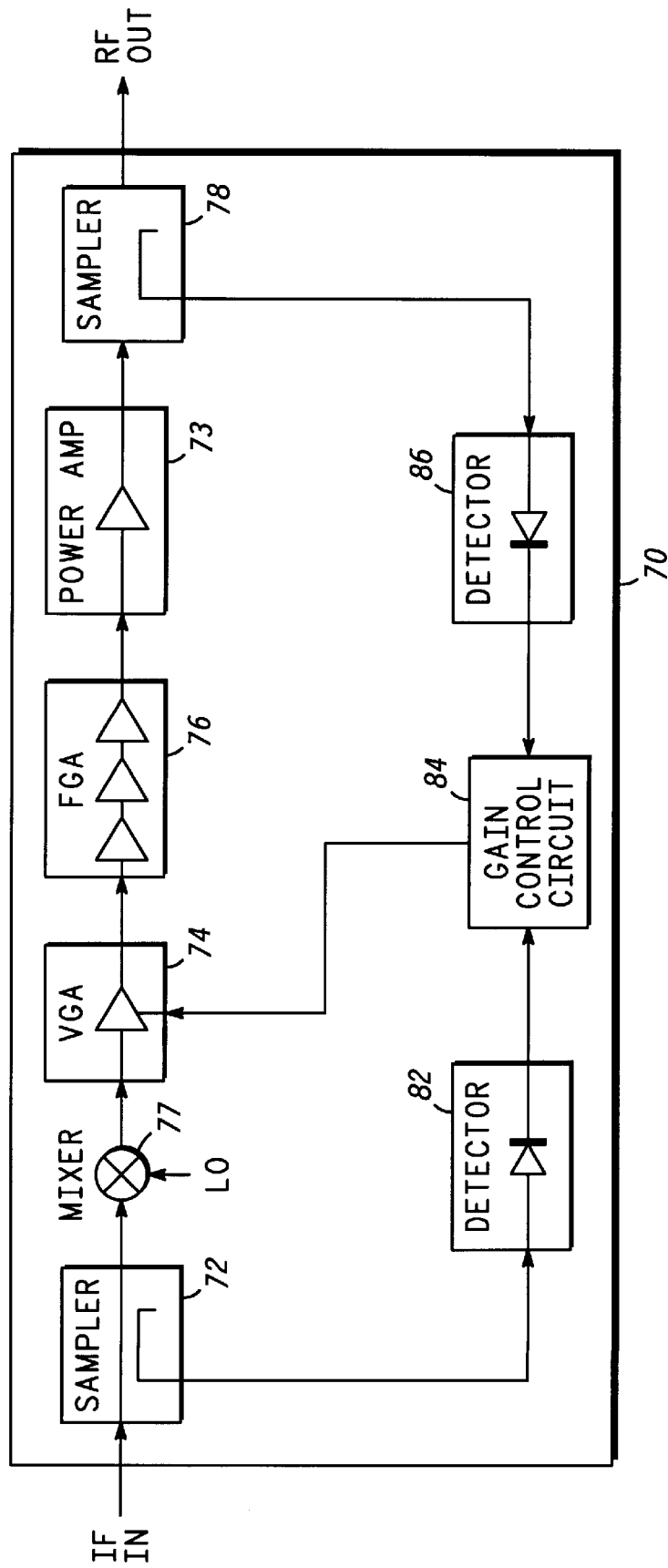
FIG. 4 is a simplified block diagram of an up-converter in accordance with a preferred embodiment of the present invention.

FIG. 4 is a simplified block diagram of an up-converter in accordance with a preferred embodiment of the present invention. Up-converter 70 includes a mixer 77 for up converting and input IF signal in the range of 650 to 850 MHz to an RF signal between 23.18 and 23.38 GHz. Up-converter 70 preferably includes power amplifier 73 coupled between fixed gain amplifier 76 and output sampler 78. Up-converter 70 is preferably used in a transmit or transmitter module while down converter 50 (FIG. 3) is used in a receiver module. In up-converter 70, an IF input signal is sampled in sampler 72 and converted to a sampled signal proportional to the IF input signal provided to detector 82. The input signal is also provided to mixer 77 where it is up converted to an RF frequency provided to variable gain amplifier 74. VGA 74, fixed gain amplifier 76, sampler 78, detectors 82 and 86, and gain control circuit 84 operate substantially similar to the corresponding circuit components of FIG. 1 amplifier 10. Accordingly, up-converter 70 provides a substantially constant gain over the range of IF input frequencies (e.g., 650–850 MHz) and the associated range of RF output frequencies (e.g., 23.18–23.38 GHz). Local oscillator (LO) is preferably a fixed frequency.

Figure 5:
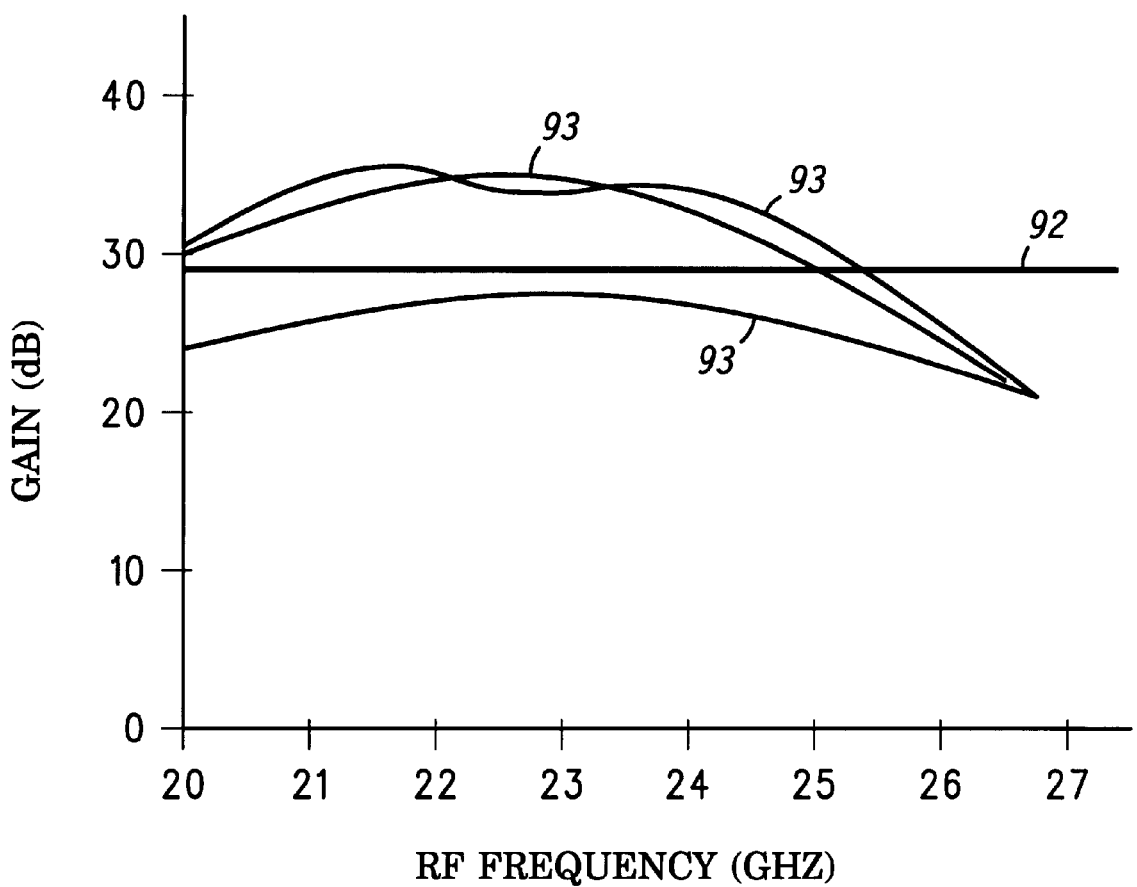
FIG. 5 is a graph illustrating the difference in performance between an amplifier circuit without a gain control circuit and a self gain aligning amplifier in accordance with a preferred embodiment of the present invention.

FIG. 5 is a graph illustrating the difference in performance between an amplifier circuit without a gain control circuit and a self gain aligning amplifier in accordance with a preferred embodiment of the present invention. Response curve 92 is a typical frequency response of amplifier 10 of FIG. 1. Response curves 93 show typical response curves of similar amplifier devices without gain control circuit 24. Response curves 92 and 93 are swept frequency responses across the operating frequency brand. Note that the gain variation of response curve 92 is substantially flat composed with response curve 93.

Figure 6:
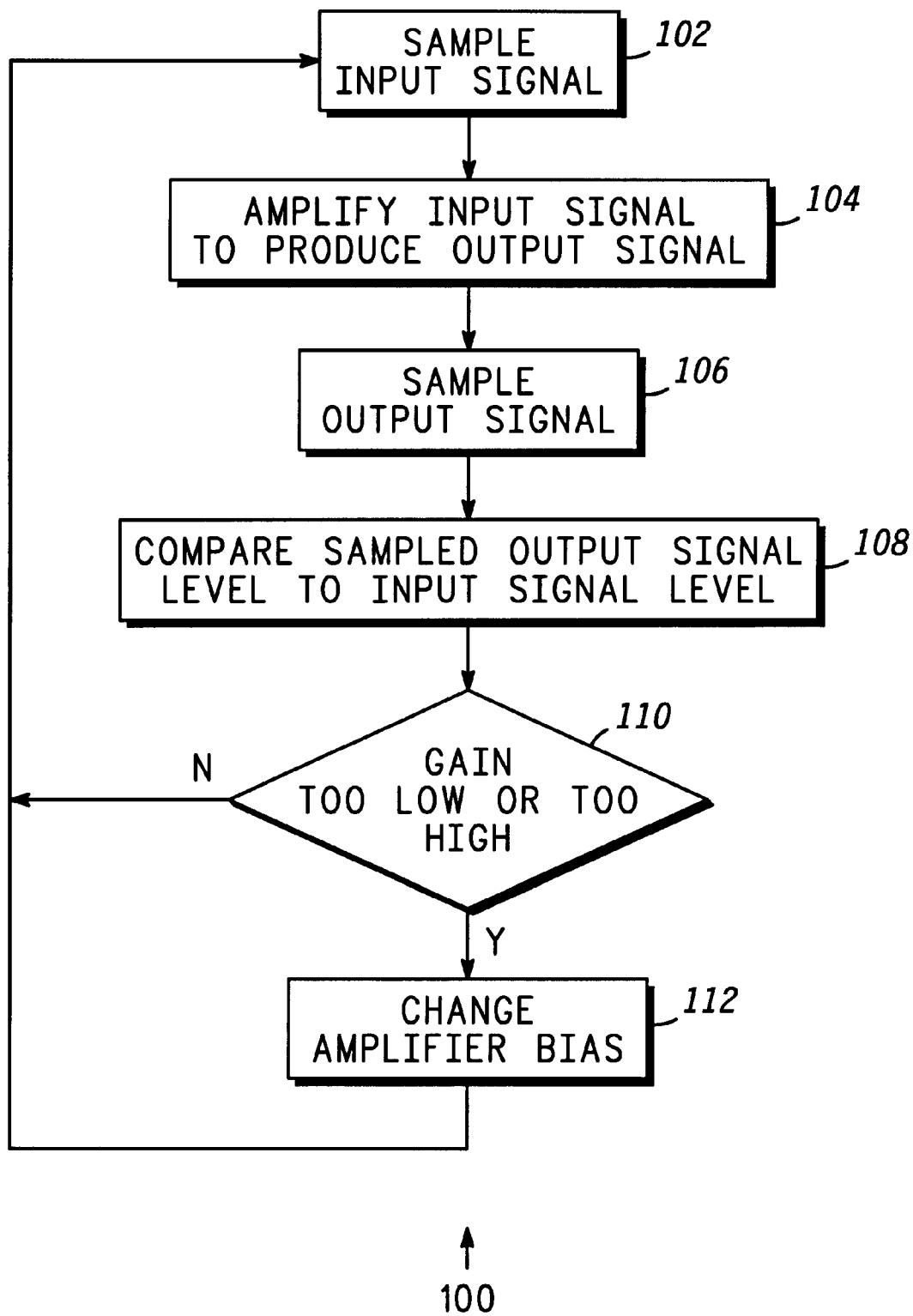
FIG. 6 is a simplified flow chart of a self gain aligning process in accordance with a preferred embodiment of the present invention.

FIG. 6 is a simplified flow chart of a self gain aligning process in accordance with a preferred embodiment of the present invention. In task 102, the input signal is sampled. In task 104, the input signal is amplified in a VGA or fixed gain amplifier or both. In task 106, the output signal provided by the fixed gain amplifier is sampled. In task 108, the sampled input and output signals are compared. Task 110 determines if the gain is too high or too low based on this comparison. If the gain is too high or too low task 112 changes the amplifier bias accordingly. If the gain is neither too high nor too low, task 112 is not performed. After task 112 or task 110, the process returns to task 102 which again samples the input signal. In the preferred embodiment, amplifier 10 (FIG. 1) may perform this procedure substantially continuously during its operation.

In summary, the invention comprises two samplers which are preferably identical and have substantially identical coupling factors, coupled to detectors which respectively detect an input and an output RF signal. These two reference signals are provided to a differential gain control circuit, which is coupled to one or more variable gain amplifier stages. The VGAs compensate for the gain of the entire chain of amplifiers. When the individual amplifier gains vary for any reason, (i.e., process, temperature effects or end of life degradation), this change in gain will cause higher or lower level of detected output reference signals for a given RF input signal. This causes the gain control circuit to drive the VGA up or down as appropriate. By maintaining a constant offset in input and output reference control signals, gain control circuit drives an amplifier chain to a constant gain. Accordingly, the need for alignment due to fabrication processes in high frequency microwave hardware is virtually eliminated. Also eliminated, is the need for temperature compensation circuits that employ thermistors. Accordingly, the reliability is improved. The invention also automatically compensates for end of life performance degradation in any of these devices. Furthermore, ripple is flattened out against a wide bandwidth in any swept frequency or multiple channel system.

Typical automatic gain control (AGC) and automatic level control (ALC) loops alternatively, provide for signal level compensation by adjusting the gain of a VGA based on a detective level of an output RF signal. These typical AGC and ALC loops provide a constant signal level. The present invention, on the other hand, provides a constant gain for an amplifier circuit. Furthermore, the addition of an input detector sampler to determine input drive level allows a gain block, (i.e., fixed gain amplifiers (FGAs) and/or VGAs) to self-compensate and operate independently. This allows virtual complete autonomy for each defined element of a system.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A constant gain amplifier circuit comprising:
   an input coupler for providing a first RF signal proportional to an RF input signal;
   a variable gain amplifier for amplifying said RF input signal and providing an RF output signal;
   an output coupler for providing a second RF signal proportional said RF output signal;
   a differential gain control circuit for providing a gain control signal to said variable gain amplifier proportional to a difference between levels of said first and second RF signals, wherein said gain control signal causes said constant gain amplifier circuit to maintain substantially constant gain over a range of RF frequencies; and
   a fixed gain amplifier coupled to an output of said variable gain amplifier for amplifying said RF output signal, said fixed gain amplifier providing a third RF signal to an input of the output coupler, the output coupler providing the second signal directly proportion to signal level of the third signal, said differential gain control providing said gain control signal causing the variable gain amplifier to compensate for variations in gain of said fixed gain amplifier.

2. A constant gain amplifier circuit as claimed in claim 1 wherein said variable gain amplifier is coupled to an output of said input coupler and amplifies said RF input signal in response to said gain control signal, and wherein said variations in gain of the fixed gain amplifier include gain variations over temperature.

3. A constant gain amplifier circuit as claimed in claim 2 wherein said first and second signal are RF signals proportional to said RF input signal level and third signal level respectively, and wherein said constant gain amplifier circuit further comprises:
   an input detector for converting said first signal to a input reference voltage; and
   an output detector for converting said second signal to an output reference voltage, and
   wherein said differential gain control circuit provides the gain control signal proportional to a difference between said input and output reference voltage causing said constant gain amplifier circuit to provide substantially constant gain over said range of RF frequencies.

4. An amplifier circuit comprising:
   an input sampler for providing a sampled input signal proportional to an RF input signal;
   a variable gain amplifier for amplifying said RF input signal and providing an RF output signal;
   an output sampler for providing a sampled output signal proportional said RF output signal; and
   a gain control circuit for providing a gain control signal to said variable gain amplifier proportional to a difference between said sampled input and sampled output signals causing said amplifier circuit to have substantially constant gain for RF input signals over a plurality of RF frequencies;
   a fixed gain amplifier coupled to an output of said variable gain amplifier for amplifying said RF output signal by a predetermined amount,
   wherein said variable gain amplifier is coupled to an output of said input sampler and amplifies said RF input signal in response to said gain control signal; and
   wherein said sampled input signal and said sampled output signal are RF signals proportional to said RF input and RF output signal respectively, and wherein said amplifier circuit further comprises:
      an input detector for converting said sampled input signal to a input reference voltage; and
      an output detector for converting said sampled output signal to an output reference voltage,
      wherein said gain control circuit comprises a voltage divider for reducing said output reference voltage; and
      a comparator for comparing said reduced output reference voltage to said input reference voltage, said comparator producing said gain control signal.

5. An amplifier circuit as claimed in claim 4 wherein said gain control circuit further comprises:
   a signal conditioner for shifting said output voltage and producing a shifted output voltage; and
   a bias control circuit for generating current for said variable gain amplifier based on said shifted output voltage from said signal conditioner.

6. An amplifier circuit as claimed in claim 4 wherein:
- said input and output samplers are edge coupled microstrip lines fabricated on an insulating substrate and provide said sampled input and output signals at least 15 dB below said RF input and output signals respectively; and
- said variable gain amplifier and said fixed gain amplifier are fabricated on a Gallium Arsenide substrate, said fixed gain amplifier including a constant current source for bias control.

7. An amplifier circuit as claimed in claim 4 wherein said RF input signal is a continuous wave signal between a plurality of RF frequencies, said RF frequencies ranging between 18 and 30 GHz, and wherein said fixed gain amplifier has differing frequency response characteristics over said RF frequencies, and wherein said variable gain amplifier has a gain that is varied by said gain control circuit to compensate for said differing frequency response characteristics of said fixed gain amplifiers, whereby said amplifier circuit has substantially constant gain for RF input signals over said plurality of RF frequencies.

8. An amplifier circuit as claimed in claim 4 wherein said RF input signal is a continuous wave signal between said plurality of RF frequencies, said RF frequencies ranging between 18 and 30 GHz, and wherein said fixed gain amplifier has differing frequency response characteristics over a temperature range, and wherein said variable gain amplifier has a variable gain that is varied by said gain control circuit to compensate for said differing frequency response characteristics of said fixed gain amplifiers over said temperature range, whereby said amplifier circuit has substantially constant gain for RF input signals over said temperature range.

9. An amplifier circuit as claimed in claim 4 wherein said RF input signal is a continuous wave signal between said plurality of RF frequencies, said RF frequencies ranging between 23.18 and 23.38 GHz, said amplifier circuit further comprises:
- a low noise amplifier coupled between said input sampler and said variable gain amplifier for amplifying said input signal; and
- a mixer coupled between said fixed gain amplifier and said output sampler for down converting said RF input signal to down converted signals of an intermediate frequency (IF) signal having a frequency range of between 650 and 850 MHz, and wherein
- said output sampler provides said sampled output signal proportional to said IF signal to said gain control circuit, whereby said amplifier circuit has substantially constant gain over said frequency range of IF signal.

10. An amplifier circuit as claimed in claim 4 wherein said RF input signal is an intermediate frequency (IF) signal having a frequency range of between 650 and 850 MHz, said amplifier circuit further comprises:
- a mixer coupled between said input sampler and said variable gain amplifier for upconverting said RF input signal to upconverted signals ranging from 23.18 to 23.38 GHz, and providing said upconverted signals to said variable gain amplifier; and
- a power amplifier coupled between said fixed gain amplifier and said output sampler for amplifying said RF signals by a predetermined amount, and
- wherein said input sampler provides said sampled input signal proportional to said IF signal to said gain control circuit, whereby said amplifier circuit has substantially constant gain over said frequency range of IF signal.

11. A constant gain frequency conversion circuit comprising:
- an input coupler for providing a first coupled RF signal proportional to an RF input signal, said RF input signal being within a first range of frequencies;
- a mixing element for converting said RF input signal to a converted input signal having a frequency within a second range of frequencies;
- a variable gain amplifier for amplifying said RF input signal based on a gain control signal and providing an amplified input signal;
- an output coupler for providing a second coupled RF signal proportional to said amplified input signal; and
- a differential gain control circuit for providing said gain control signal to said variable gain amplifier, said gain control signal being proportional to a difference between signal levels of said first and second coupled RF signals and causing said variable gain amplifier to change a gain associated therewith, said constant gain frequency conversion circuit maintaining a substantially constant gain for input frequencies over said first range of frequencies.

12. A method of amplifying a signal in an amplifier circuit comprising the steps of:
- coupling an RF input signal to provide a first coupled RF signal proportional to said RF input signal;
- amplifying said RF input signal in a variable gain amplifier (VGA) to provide an amplified RF signal, said VGA having a gain controllable by a gain control signal;
- amplifying said amplified RF signal in a fixed gain amplifier to provide an RF output signal;
- coupling said RF output signal to provide a second coupled RF signal proportional to said RF output signal;
- providing said gain control signal to said VGA based on a difference between signal levels of said first and second coupled RF signals causing said amplifier circuit to maintain a substantially constant gain over a range of RF frequencies, wherein said first and second coupled RF signals are proportional to signal levels of said RF input and RF output signal respectively;
- converting, using an input detector, said sampled input signal to a input reference voltage; and
- converting, using an output detector, said sampled signal to an output reference voltage.

13. A method of amplifying a signal in an amplifier circuit comprising the steps of:
- sampling an RF input signal to provide a sampled input signal proportional to said RF input signal;
- amplifying said RF input signal in a variable gain amplifier (VGA) to provide an amplified RF signal, said VGA having a gain controllable by a gain control signal;
- amplifying said amplified RF signal in a fixed gain amplifier to provide an RF output signal;
- sampling said RF output signal to provide a sampled output signal proportional to said RF output signal; and
- providing said gain control signal to said VGA based on a difference between said sampled input and sampled output signals causing said amplifier circuit to provide a substantially constant gain for RF input signals over a plurality of RF frequencies,
- wherein said sampled input signal and said sampled output signal are proportional to said RF input and RF output signal respectively, and wherein the method further comprises the steps of:

converting, using an input detector, said sampled input signal to a input reference voltage; and converting, using an output detector, said sampled output signal to an output reference voltage, and wherein said RF input signal is a continuous wave signal between said plurality of RF frequencies, said RF frequencies ranging between 18 and 30 GHz, and wherein said fixed gain amplifier has different frequency response characteristics over said RF frequencies, and wherein the method further comprises the step of varying said gain of said variable gain amplifier by a gain control circuit to compensate for said different frequency response characteristics of said fixed gain amplifier, whereby said amplifier circuit maintains substantially constant gain for RF input signals over said frequencies.

14. A method as claimed in claim 13 wherein said fixed gain amplifier has a different frequency response characteristics over a temperature range, and wherein the method further comprises the step of varying a variable gain of said variable gain amplifier by a gain control circuit to compensate for said different frequency response characteristics of said fixed gain amplifier over said temperature range, whereby said amplifier circuit maintains substantially constant gain for RF input signals over said temperature range.

15. A method as claimed in claim 13 further comprising the steps of:

amplifying said RF input signal with a low noise amplifier coupled between an input sampler and said variable gain amplifier;

down converting said RF input signal to an intermediate frequency (IF) signal using a mixer coupled between said fixed gain amplifier and an output sampler; and providing said sampled output signal proportional to said IF signal to a gain control circuit, whereby said amplifier circuit maintains substantially constant gain over a predetermined frequency range of IF signal.

16. A method as claimed in claim 13 further comprising the steps of:

upconverting said RF input signal with a mixer coupled between an input sampler and said variable gain amplifier to provide an upconverted signal;

providing said upconverted signal to said variable gain amplifier; and amplifying said RF output signals by a predetermined amount with a power amplifier coupled between said fixed gain amplifier and an output sampler, wherein said input sampler provides said sampled input signal proportional to said IF signal to a gain control circuit, whereby said amplifier circuit maintains substantially constant gain over a predetermined frequency range of said IF signal.

* * * * *